(12) United States Patent
Wu et al.

(10) Patent No.: US 9,595,335 B2
(45) Date of Patent: *Mar. 14, 2017

(54) MEMORY DEVICE AND SYSTEMS AND METHODS FOR SELECTING MEMORY CELLS IN THE MEMORY DEVICE

(71) Applicant: Atmel Corporation, San Jose, CA (US)

(72) Inventors: Tsung-Ching Wu, Saratoga, CA (US); Geeng-Chuan Chern, Cupertino, CA (US); Steven Schumann, Los Altos, CA (US); Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/857,958

(22) Filed: Sep. 18, 2015

(65) Prior Publication Data

US 2016/0005477 A1 Jan. 7, 2016

Related U.S. Application Data

(63) Continuation of application No. 13/921,567, filed on Jun. 19, 2013, now Pat. No. 9,142,306.

(60) Provisional application No. 61/751,447, filed on Jan. 11, 2013.

(51) Int. Cl.
*G11C 16/14* (2006.01)
*G11C 16/16* (2006.01)
*G11C 16/04* (2006.01)
*G11C 16/26* (2006.01)

(52) U.S. Cl.
CPC .......... *G11C 16/14* (2013.01); *G11C 16/0433* (2013.01); *G11C 16/16* (2013.01); *G11C 16/26* (2013.01); *G11C 2213/82* (2013.01); *G11C 2216/28* (2013.01)

(58) Field of Classification Search
CPC ............ G11C 16/0433; G11C 2213/82; G11C 2216/28; G11C 16/14; G11C 16/16
See application file for complete search history.

(56) References Cited

U.S. PATENT DOCUMENTS

| | | | |
|---|---|---|---|
| 6,266,274 B1 * | 7/2001 | Pockrandt | G11C 16/0433 365/185.05 |
| 6,940,758 B2 * | 9/2005 | Chung | G11C 16/08 365/185.05 |
| 8,339,862 B2 | 12/2012 | Alika et al. | |
| 8,462,553 B2 * | 6/2013 | Lee | G11C 16/0433 365/185.2 |
| 2004/0027856 A1 | 2/2004 | Lee et al. | |
| 2012/0063223 A1 | 3/2012 | Lee et al. | |
| 2014/0198571 A1 | 7/2014 | Wu et al. | |

* cited by examiner

*Primary Examiner* — Vanthu Nguyen
(74) *Attorney, Agent, or Firm* — Fish & Richardson P.C.

(57) ABSTRACT

A memory device comprises memory cells arranged in rows and columns, and source lines associated with memory sections, each of which includes a plurality of memory cells. Source terminals of transistors included in the memory cells in a first memory section are physically coupled to a first source line that is distinct from other source lines associated with other memory sections on a same row of the memory device as the first memory section. Gate terminals of transistors included in memory cells in a row share a common wordline configured for providing a signal to the gate terminals.

21 Claims, 7 Drawing Sheets

MEMORY DEVICE AND SYSTEMS AND METHODS FOR SELECTING MEMORY CELLS IN THE MEMORY DEVICE

CROSS-REFERENCE TO RELATED APPLICATION

This application is a continuation and claims priority to U.S. patent application Ser. No. 13/921,567 filed on Jun. 19, 2013 which claims priority to U.S. Provisional Patent Application Ser. No. 61/751,447 filed Jan. 11, 2013, and entitled "SELECTING MEMORY CELLS," the contents of which are incorporated herein by reference.

TECHNICAL FIELD

This disclosure relates generally to selecting memory cells in a memory device.

BACKGROUND

A memory device generally includes memory cells arranged in an array, with memory cells in a row sharing the same wordline, while memory cells in a column share the same bitline. A memory cell may include a select transistor and a sense transistor. In a row, memory cells may be grouped into sections of memory cells. Each section may include 8 memory cells, which make up a memory byte. Alternatively, each section may include 12 memory cells (comprising 1.5 bytes), 16 memory cells (comprising 1 word), 32 memory cells (comprising 2 words) or some other suitable number of memory cells.

SUMMARY

This disclosure describes memory devices that use separate source lines to select memory bytes to perform functions that are typically done by the byte select transistor, such as byte erase and write. The byte select transistor may not be present in such memory devices, leading to considerable savings of the device area.

In one aspect, a memory device comprises memory cells arranged in rows and columns, and source lines associated with memory sections, each of which includes a plurality of memory cells. Source terminals of transistors included in the memory cells in a first memory section are physically coupled to a first source line that is distinct from other source lines associated with other memory sections on a same row of the memory device as the first memory section. Gate terminals of transistors included in memory cells in a row share a common wordline configured for providing a signal to the gate terminals.

Implementations of the memory device may include one or more of the following features. A memory section may include a plurality of consecutive memory cells arranged in a row, forming a memory group. The memory section may include at least eight consecutive memory cells arranged in a row. The memory group may include at least one of a memory byte and a memory word. The memory device may be configured without byte select transistors for controlling the memory sections.

The first source line may be common for all memory sections that are included in a same column of the memory device as the first memory section. The first source line may be common for a subset of memory sections that are included in a same column of the memory device as the first memory section. Each column of the memory device may include a plurality of subsets of memory sections, each subset of memory sections associated with a source line that is different from source lines associated with other subsets of memory sections.

Each row of memory cells may be selectable by a same wordline and each column of memory cells may be selectable by a same bitline. A memory cell may include a select transistor and a sense transistor. The select transistor may comprise a gate terminal coupled to gate terminals of select transistors in other memory cells in a same row to form a wordline, and a drain terminal coupled to drain terminals of select transistors in other memory cells in a same column to form a bitline. The sense transistor may comprise a gate terminal coupled to gate terminals of sense transistors in other memory cells in the same row to form a sense gate line, and a source terminal configured as the source of the memory cell.

For an erase operation of the first memory section, the first source line may be configured for providing a preset first voltage at a same time the source lines for the other memory sections on the same row are configured for providing a preset second voltage that is different from the first voltage. A wordline and a sense gate line corresponding to the first memory section may be configured for providing preset non-zero voltages. Other wordlines and sense gate lines corresponding to memory sections in other rows may be configured for providing zero voltage.

For a write operation of a first memory cell included in the first memory section, a wordline and a bitline corresponding to the first memory cell may be configured for providing preset non-zero voltages, while a sense gate line corresponding to the first memory cell may be configured for providing zero voltage. Other wordlines and sense gate lines corresponding to memory sections in other rows may be configured for providing zero voltage. The write operation may be independent of voltages provided by the first source line and source lines corresponding to the other memory sections.

The memory device may comprise an Electrically Erasable Programmable Read-Only Memory (EEPROM).

In another aspect, a system includes a memory device comprising memory cells arranged in rows and columns, and source lines associated with memory sections, wherein a memory section includes a plurality of memory cells. Source terminals of transistors included in the memory cells in a first memory section are physically coupled to a first source line that is distinct from other source lines associated with other memory sections on a same row of the memory device as the first memory section. Gate terminals of transistors included in memory cells in a row share a common wordline configured for providing a signal to the gate terminals.

The system also includes instructions stored in a non-transitory machine readable medium for execution by a processor. The instructions are configured to cause the processor to perform operations comprising selecting the first memory section for an erase operation by providing a preset first voltage on the first source line while providing a preset second voltage different from the first voltage on the source lines for the other memory sections on the same row. The instructions are also configured to cause the processor to perform operations comprising providing preset non-zero voltages on a wordline and a sense gate line, respectively, corresponding to the first memory section, while providing zero voltage on other wordlines and sense gate lines corresponding to memory sections in other rows of the memory device.

Implementations of the system may include one or more of the following features. A memory section may include a plurality of consecutive memory cells arranged in a row, forming a memory group. The memory section may include at least eight consecutive memory cells arranged in a row. The memory group may include at least one of a memory byte and a memory word. The memory device may be configured without byte select transistors for controlling the memory sections.

The first source line may be common for all memory sections that are included in a same column of the memory device as the first memory section. The first source line may be common for a subset of memory sections that are included in a same column of the memory device as the first memory section. Each column of the memory device may include a plurality of subsets of memory sections, each subset of memory sections associated with a source line that is different from source lines associated with other subsets of memory sections.

Each row of memory cells in the memory device may be selectable by a same wordline and each column of memory cells may be selectable by a same bitline. A memory cell may include a select transistor and a sense transistor. The select transistor may comprise a gate terminal coupled to gate terminals of select transistors in other memory cells in a same row to form a wordline, and a drain terminal coupled to drain terminals of select transistors in other memory cells in a same column to form a bitline. The sense transistor may comprise a gate terminal coupled to gate terminals of sense transistors in other memory cells in the same row to form a sense gate line, and a source terminal configured as the source of the memory cell.

The instructions may be configured to cause the processor to perform operations comprising selecting a first memory cell included in the first memory section for a write operation by providing preset non-zero voltages on a wordline and a bitline corresponding to the first memory cell while providing zero voltage on a sense gate line corresponding to the first memory cell. The instructions may be further configured to cause the processor to perform operations comprising providing zero voltage on other wordlines and sense gate lines corresponding to memory sections in other rows. The write operation may be independent of voltages provided by the first source line and source lines corresponding to the other memory sections.

The memory device may comprise an Electrically Erasable Programmable Read-Only Memory (EEPROM).

Implementations of the above include a method and a computer program product. The method is configured to perform the operations described above. The computer program product is suitably embodied in a non-transitory machine-readable medium and includes instructions executable by one or more processors. The instructions are configured to cause the one or more processors to perform the above described operations.

The details of one or more disclosed implementations are set forth in the accompanying drawings and the description below. Other features, aspects, and advantages will become apparent from the description, the drawings and the claims.

DETAILED DESCRIPTION

In a conventional memory device, a section of memory may be controlled by a byte select transistor. For example, in an electrically erasable programmable read-only memory (EEPROM) device, each byte of memory can be associated with its own byte select transistor, which is connected to the memory cells that comprise the respective byte. A byte of memory, which is also referred to interchangeably as a memory byte or simply a byte, typically comprises eight memory cells, with each memory cell storing the value for a binary digit (bit). However, in some implementations, the memory section that is controlled by a byte select transistor may comprise a number of memory cells different from one byte.

A byte select transistor may occupy a considerable area of the memory that is associated with the corresponding byte. For example, the byte select transistor may occupy 30% or more of the area of the corresponding byte. For some memory devices such as high-density memory, the byte select transistor may occupy a high percentage of the total chip area. It may be useful to implement memory devices where a greater percentage of the chip area includes memory cells that are used for storing data. This may be achieved by implementing an alternative to the byte select transistor for selecting memory bytes.

In some implementations, a memory device that implements an alternative mechanism to the byte select transistor may be realized by using separate source lines to select memory bytes to perform functions that are typically done by the byte select transistor, such as byte erase and write. Therefore, the byte select transistor may be removed from the memory device, leading to considerable savings of the device area.

Figure 1:
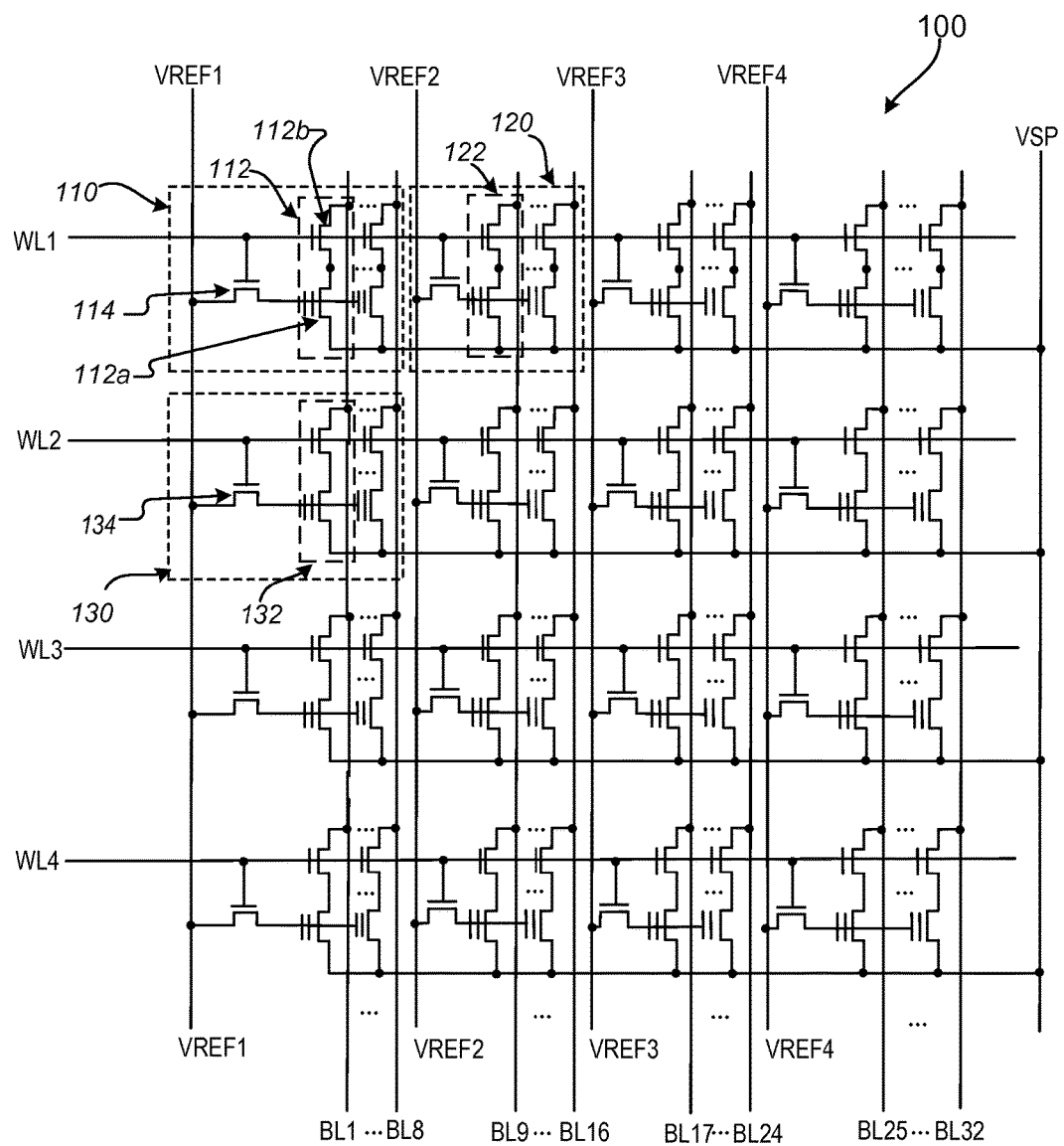
FIG. 1 is a conceptual block diagram of an exemplary conventional memory device that uses byte select transistors for selecting memory bytes.

FIG. 1 is a conceptual block diagram of an exemplary conventional memory device 100 that uses byte select transistors for selecting memory bytes. The conventional memory device 100 includes a number of memory cells, such as 112 or 122. Each memory cell includes transistors such as 112a and 112b. Memory cells are grouped into bytes, such as 110, 120 or 130. Each byte is associated with a byte select transistor, such as 114. The bytes of memory cells are arranged in rows and columns. Each row of memory bytes has a common wordline, for example, WL1, WL2, WL3 or WL4. Each column of memory corresponding to a byte, which is also known as a byte column, is associated with a set of bitlines, for example, BL1-BL8, BL9-BL16, BL17-BL24 or BL25-BL32. In addition, each byte column is associated with a reference voltage line, such as VREF1, VREF2, VREF3 or VREF4. The conventional memory device 100 also includes a source line VSP that is associated with all the memory cells.

In some implementations, each memory cell in conventional memory device 100 includes a pair of transistors. For example, memory cell 112 includes sense transistor 112a and select transistor 112b. The sense transistor 112a is configured for storing a charge representing the value of the bit associated with memory cell 112, while the select transistor 112b is configured for selecting the memory cell 112.

The memory bytes in the memory device 100 are arranged in rows and columns. For example, bytes 110 and 120 are in the same row, while bytes 110 and 130 are in the same column of the conventional memory device 100.

Each byte of memory includes a group of eight consecutive memory cells in one row of the memory device. For example, the byte 110 includes memory cell 112 and seven other memory cells, which are all present on the row associated with the wordline WL1. Although FIG. 1 shows each byte with only two memory cells, it will be understood that each byte may include eight memory cells.

A wordline is coupled to all the memory cells in a byte, and to memory cells in all other bytes that are on the same row in the conventional memory device 100. For example, wordline WL1 is coupled to the memory cells of byte 110, and also to the memory cells of byte 120.

Each byte column of the conventional memory device 100 includes a reference voltage line and eight bitlines. Each bitline is coupled to the corresponding vertically stacked memory cells in other bytes in the same column of the memory device. For example, reference voltage line VREF1 and the bitlines BL1 to BL8 are associated with the first byte column of the conventional memory device 100 shown in FIG. 1, which includes bytes 110 and 130. The first bitline, BL1, is coupled to the first memory cell 112 in byte 110, and to the first memory cell 132 in the byte 130 that is vertically stacked below 112. Bitline BL8 is coupled to the eighth memory cell in each byte 110 and 130.

Each byte in the memory device 100 also includes a byte select transistor. For example, byte 110 includes byte select transistor 114, while byte 130 includes byte select transistor 134. The byte select transistor in each byte is connected to the gates of the sense transistors in the respective byte. For example, the source of byte select transistor 114 is coupled to the gates of the eight sense transistors, including 112a, which correspond to the eight memory cells included in the byte 110.

In the conventional memory device 100, the gate terminals of the sense transistors are common for a given memory byte, the gate terminals being coupled to each other and to the byte select transistor corresponding to the memory byte. However, the gate terminals of the sense transistors for a given memory byte are distinct from the gate terminals of the sense transistors for any other memory byte.

For each row of the conventional memory device 100, the associated wordline is also connected to the gate terminals of the byte select transistors corresponding to the row. For example, WL1 is connected to the gate of byte select transistor 114, while WL2 is coupled to the gate of byte select transistor 134.

For each column of the conventional memory device 100, the associated reference voltage line is coupled to the drain terminals of the byte select transistors included in the bytes associated with the column. For example, in the first column, the reference voltage line VREF1 is connected to the byte select transistors 114 and 134.

In the conventional memory device 100, a memory byte may be selected by biasing the byte select transistor corresponding to the memory byte. In some implementations, this is achieved by selecting the wordline corresponding to the row associated with the memory byte, and the reference voltage line and bitlines corresponding to the column associated with the memory byte. For example, to select memory byte 110 for erase, a certain high voltage is applied to wordline WL1 and to VREF1, while a zero voltage is applied to the other wordlines and other voltage lines. In addition, zero voltage is applied to bitlines BL1 to BL8 and/or the source line VSP. All other terminals can be connected to zero voltage or floating. These bias conditions cause electrons to flow into floating gate of all sense transistors in byte 110 while leaving other sense transistors intact. Thus, byte 110 is selected for erase.

As described previously, the byte select transistor occupies a considerable area of the memory byte. For example, the area occupied by the byte select transistor may be 30% or more of the area of the corresponding memory byte. For high density devices, the area used by the byte select transistor may represent a high percentage of the total chip area. Therefore, a memory device that does not use byte select transistors for selecting memory bytes may save chip area, and may lead to memory devices of smaller sizes, or with higher densities of data storage for a given size.

FIGS. 2A-2D are conceptual block diagrams of exemplary memory devices 200A-200D that use source lines for selecting memory bytes. The memory devices 200A-200D are examples of memory devices that do not use byte select transistors for selecting memory bytes.

Figure 2A:
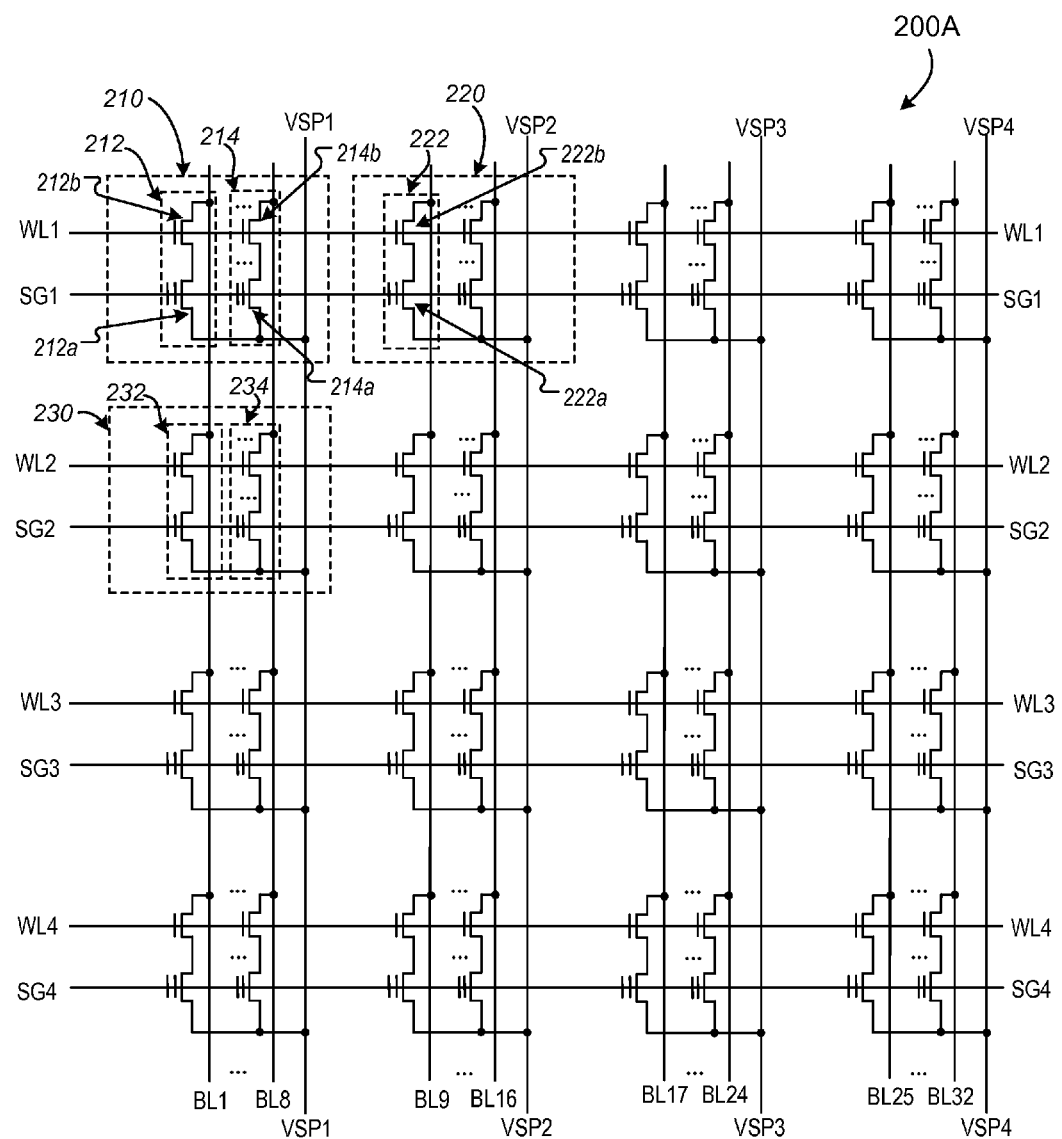
FIGS. 2A-2D are conceptual block diagrams of exemplary memory devices that use source lines for selecting memory bytes.

In the memory device 200A shown in FIG. 2A, each byte column is associated with a source line that is different from the source line associated with other byte columns. The memory device 200A includes memory cells, such as 212, 214, 222, 232 and 234. Each memory cell includes a pair of transistors, for example, 212a and 212b included in memory cell 212; 214a and 214b included in memory cell 214; and 222a and 222b included in memory cell 222. The memory cells are grouped into memory sections, such as 210, 220 or 230. The memory sections, each of which includes multiple memory cells, for example, 8, 12, 16 or 32, are arranged in rows and columns. Each row of memory bytes has a common wordline, for example, WL1, WL2, WL3 or WL4. In addition, each row of memory bytes has a common sense gate line, for example, SG1, SG2, SG3 or SG4. Each column of memory bytes is associated with a set of bitlines, for example, BL1-BL8, BL9-BL16, BL17-BL24 or BL25-BL32. The memory device 200A includes a number of source lines, such as VSP1, VSP2, VSP3 or VSP4, with each memory byte connected to a source line. For the rest of the description, each memory section will be considered to include 8 bits, such that a memory section corresponds to a memory byte. However, it will be understood that the description is equally applicable to memory sections with different numbers of bits.

The memory device 200A may be any appropriate memory device. For example, the memory device may be a read-only memory (ROM), including various types of a ROM such as an erasable programmable read-only memory (EPROM) or an EEPROM. In some implementations, the memory device 200A may represent a section of a larger memory device that includes a large number of memory cells.

In some implementations, each memory cell in the memory device 200A includes a sense transistor and a select transistor. For example, memory cell 212 includes sense transistor 212a and select transistor 212b; memory cell 214 includes sense transistor 214a and select transistor 214b, while memory cell 222 includes sense transistor 222a and select transistor 222b. In some other implementations, each memory cell in the memory device 200A may include a number of transistors greater than two, with a subset of the transistors being sense transistors, and the rest being select transistors.

The memory cells such as 212, 214, 222, 232 or 234, store information at the granularity of bits. In some implementations, each memory cell stores a particular bit value. For example, the sense transistor in a memory cell may be configured for storing a charge representing the bit value associated with memory cell, while the select transistor is configured for selecting the memory cell for reading or writing the bit value. However, in some implementations, each memory cell, such as 212, 214, 222, 232 or 234, may store several bit values. In such implementations, the memory cells 212, 214, 222, 232 or 234 may be multi-level cells (MLCs).

The memory cells in memory device 200A are grouped into bytes of memory that are arranged in rows and columns, which form a grid like pattern, such as an array. For example, memory bytes 210 and 220 are in one row of the array, while memory bytes 210 and 230 are in different rows of the array. However, the memory bytes 210 and 230 are in the same column of the array, while the memory bytes 210 and 220 are in different columns of the array.

In some configurations, the array may be a two-dimensional array of M×N memory cells, where M and N have integral values, for example, 512 or 1024. In other configurations, the array may have different dimensions, for example, the array may be a three-dimensional array.

In some implementations, each memory byte includes a group of eight consecutive memory cells in the same row of the memory device. For example, each memory byte 210, 220 and 230 comprises eight memory cells. Byte 210 includes memory cells 212, 214 and six other memory cells, which are all present on the row associated with the wordline WL1 and the sense gate line SG1. Similarly, byte 220 includes memory cell 222 and seven other memory cells present on the same row as the memory cells of byte 210. However, byte 230 includes memory cells 232, 234 and six other memory cells, which are all present on a different row that is associated with the wordline WL2 and the sense gate line SG2. Although FIG. 2 shows each memory byte with two memory cells, it will be understood that each memory byte may include eight memory cells.

In some implementations, the grouping of memory cells may be made in a different manner in the memory device 200A. For example, each unit of memory analogous to a memory byte may include a number of memory cells that is different from eight.

In some configurations, the memory bytes in each row of the memory device 200A are referred to as being on the same page of memory. Each row or page in the memory device 200A is associated with a distinct wordline and a sense gate line. For example, wordline WL1 and sense gate line SG1 may be associated with the first row of memory device 200. Wordlines and sense gate lines WL2 and SG2, WL3 and SG3, and WL4 and SG4 are associated with other rows in the memory device 200A.

In some implementations, a wordline and a sense gate line include electrical connections that are coupled to all the memory cells that are on the same page of the memory device 200. For example, wordline WL1 and sense gate line SG1 are coupled to the memory cells 212, 214 included in memory byte 210, and also to the memory cell 222 included in memory byte 220.

A wordline is coupled to the gate terminals of the select transistors on the associated page of the memory device 200A. For example, wordline WL1 is connected to the gate terminals of the select transistors 212b and 214b, and to the gate terminals of select transistors of all other memory cells in the page corresponding to WL1, such as memory cell 222. Similarly, wordline WL2 is connected to the gate terminals of select transistors of all memory cells in the page corresponding to WL2, such as memory cells 232 and 234.

A sense gate line is coupled to the gate terminals of all the sense transistors on the associated page of the memory device 200. For example, sense gate line SG1 is connected to the gate terminals of the sense transistors 212a, 214a and 222a, and to the gate terminals of sense transistors of all other memory cells in the page corresponding to SG1. Similarly, sense gate line SG2 is connected to the gate terminals of sense transistors of all memory cells in the page corresponding to SG2, such as memory cells 232 and 234.

Therefore, in the memory device 200A, the gate terminals of the sense transistors are common for all the bytes in one row or page, being coupled to the sense gate line corresponding to the page. For example, the gate terminals of the sense transistors 212a and 214a in memory byte 210 are coupled to one another, and to the gate terminals of sense transistors in other memory bytes on the same row of the memory device 200A, such as sense transistor 222a, which are all connected to sense gate line SG1.

A wordline and the associated sense gate line on the same page may be selected or unselected, that is, activated or deactivated respectively, by applying a voltage to each of the wordline and the sense gate line. Based on a wordline and the corresponding sense gate line being activated or deactivated, the select transistors in the memory cells in the corresponding page will open or close. When a wordline and corresponding sense gate line are selected, the memory cells in the corresponding page may be accessed for writing, reading or erasing operations.

Each byte column of the memory array in the memory device 200A is associated with a set of vertically stacked memory bytes. For example, the memory bytes 210 and 230 are in the first byte column of the memory device 200A as shown in FIG. 2A, while memory byte 220 is in a different byte column of the memory device 200A.

Each column includes one or more bitlines, with the number of bitlines corresponding to the number of memory cells in the associated memory bytes. For example, the column corresponding to memory bytes 210 and 230 may include eight bitlines BL1-BL8, while the column corresponding to memory byte 220 may include eight bitlines BL9-BL16, and the groups of eight bitlines BL17-BL24 and BL-BL16 correspond to other distinct byte columns of the memory device 200A.

In some implementations, a bitline includes a metallic strip, perpendicular to the wordlines that is connected to the drain terminals of the transistors included in the corresponding memory cells. For example, bitline BL1 is connected to the drain terminal of the select transistor 212b in memory cell 212, and the select transistor in memory cell 232 that is vertically stacked with memory cell 212; bitline BL8 is connected to the drain terminals of the select transistor 214b in memory cell 214, and to the select transistor in memory cell 234 that is vertically stacked with memory cell 214.

In some implementations, each byte column in the memory device 200A is associated with a source line that is different from the source lines associated with other byte columns of the memory device. For example, the column corresponding to memory cells 210 and 230 is associated with VSP1, while the column corresponding to memory cell 220 is associated with VSP2, and VSP3 and VS4 are associated with other distinct byte columns of the memory device 200A.

A line is coupled to the source terminals of the sense transistors in the corresponding column. For example, in some implementations, VSP1 is coupled to the source terminals of the sense transistors 212a and 214a, which are in memory cells 212 and 214 in one page of the memory array, and also to the source terminals of the sense transistors in memory cells 232 and 234 that are in a different page of the memory array, but in the same byte column as the memory cells 212 and 214. In such implementations, the source terminals of the sense transistors in a memory byte may be coupled to one another and to the associated source line.

Therefore, in the memory device 200A, the source terminals of the sense transistors in a memory byte may be physically connected together, but are disjoint from the source terminals of the sense transistors in other memory bytes that are on the same page of the memory device 200A. For example, source terminals of the sense transistors 212a and 214a, which are included in memory byte 210, are coupled to one another and to VSP1. However, the source terminals of the sense transistors 212a and 214a are disjoint from the source terminals of sense transistors in other memory bytes that are on the same page or row, of the memory device 200A, such as sense transistor 222a, which is connected to a different line VSP2.

As described previously, each of the lines VSP1-VSP4 may be coupled to the memory bytes in the associated byte column of the memory device 200A. For example, VSP1 is coupled to memory bytes 210 and 230, and to other memory bytes that are in page corresponding to WL3 and WL4, but in the same byte column as 210 and 230. In this manner, each VSP may be coupled to a large number of memory bytes that are vertically stacked. The number of vertically stacked memory bytes in one byte column of the memory device that have a common source line may be in the range of a few thousand.

Figure 2B:
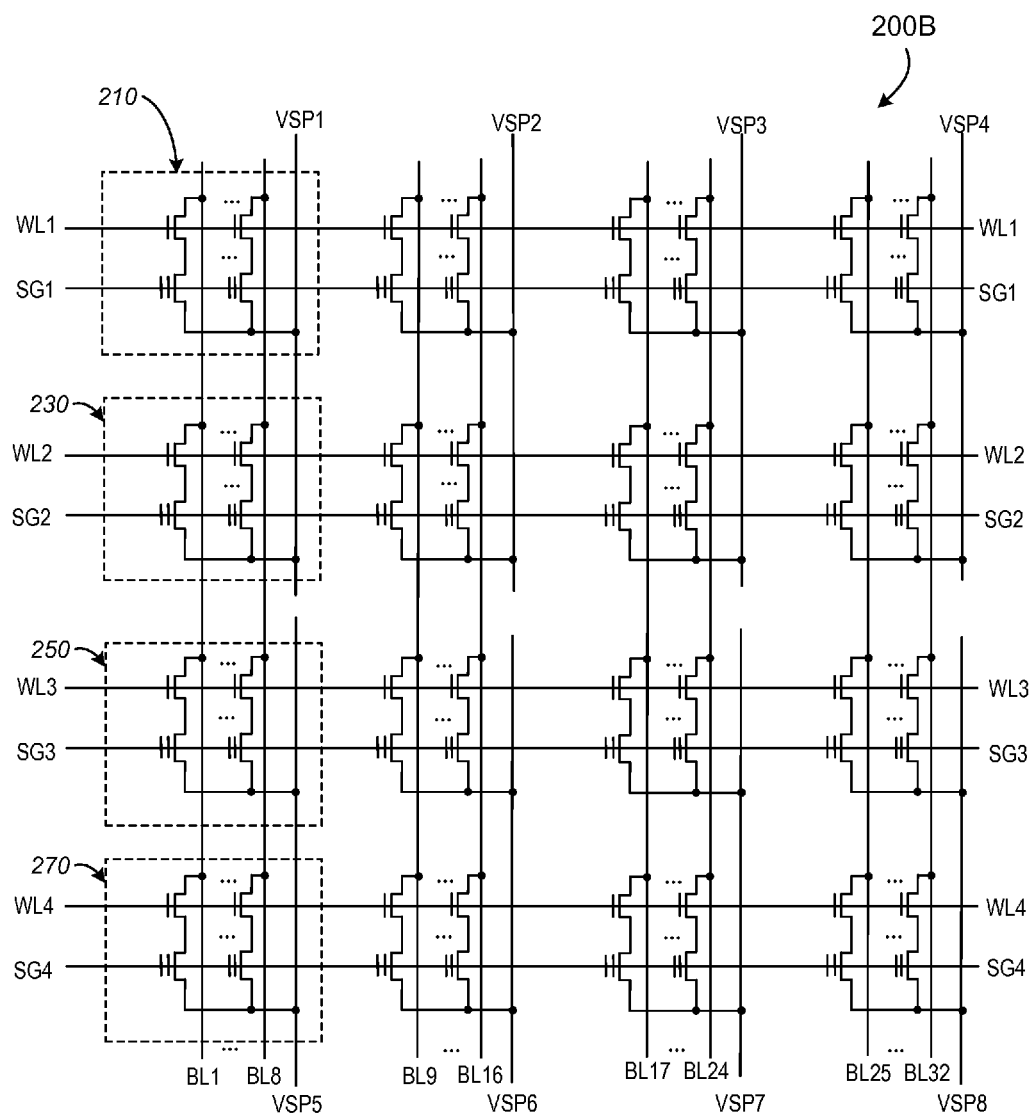

In some other implementations, only a subset of the memory bytes in a byte column of the memory device may share a common source line. Such an implementation is shown in FIG. 2B, which illustrates an exemplary memory device 200B that uses source lines for selecting memory bytes. The memory device 200B includes memory cells grouped into memory bytes, such as 210, 230, 250 and 270. The memory bytes are arranged in rows and columns. Each row or page of memory bytes has a common wordline, for example, WL1, WL2, WL3 or WL4, and a common sense gate line, for example, SG1, SG2, SG3 or SG4. Each byte column of memory bytes is associated with a set of bitlines, for example, BL1-BL8, BL9-BL16, BL17-BL24 or BL25-BL32. The memory device 200B includes a number of source lines, such as VSP1-VSP8, with each memory byte connected to a source line. In some implementations, a bitline may include a subset of bits in the same column.

The memory device 200B is similar to the memory device 200A in that it uses source lines for selecting memory bytes, and does not use byte select transistors. However, unlike memory device 200A, memory bytes in a same byte column of the memory device 200B may be connected to different source lines. For example, memory bytes 210, 230, 250 and 270 are in the same byte column of the memory device 200B. 210 and 230 shares source line VSP1, but 250 and 270 are coupled to source line VSP5 that is different from VSP1. Similarly, some of the memory bytes in the second byte column are coupled to VSP2, while some are coupled to VSP6, and so on. In such implementations, the number of memory bytes that share a source line may range from single digits to several hundred.

In some implementations, different regions of the memory device 200B may be demarcated into memory sectors. For example, the pages corresponding to wordlines WL1 and WL2 may be in one memory sector, while the pages corresponding to wordlines WL3 and WL4 may be in a different memory sector. Source lines VSP1-VSP4 may be in the first sector, while source lines VSP5-VSP8 may be in the second sector. Vertically stacked memory bytes in a byte column in one sector may share a common source line that is different from the source line shared by memory bytes in the same byte column, but in a different memory sector.

Figure 2C:
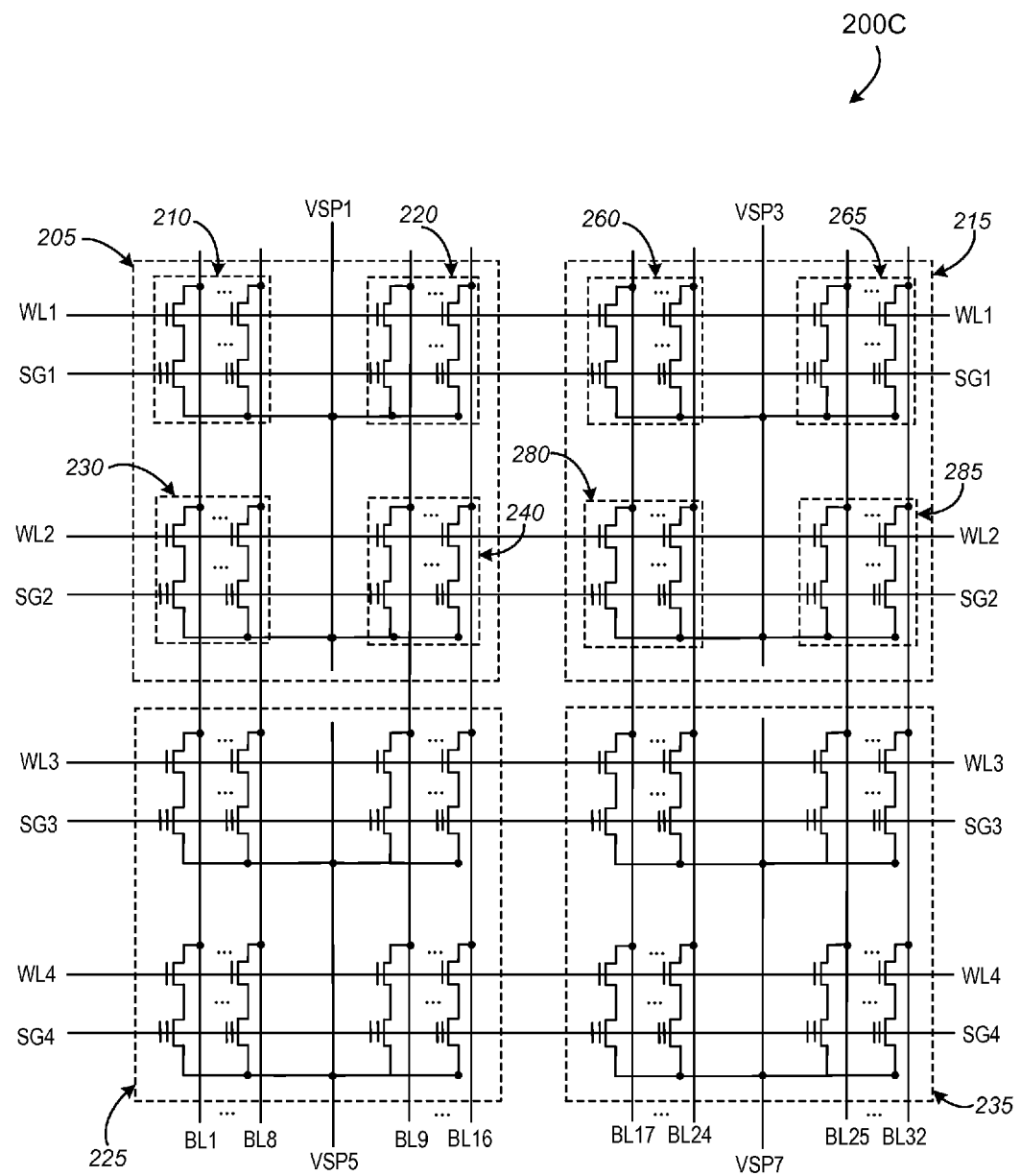

In some implementations, byte columns in the same page may be in different memory sectors. Such an implementation is illustrated in FIG. 2C, which shows an exemplary memory device 200C that uses source lines for selecting memory bytes. The memory device 200C includes memory bytes, such as 210, 220, 230, 240, 260, 265, 280 and 285, which are arranged in rows and columns. Each row of memory bytes has a common wordline, for example, WL1, WL2, WL3 or WL4, and a common sense gate line, for example, SG1, SG2, SG3 or SG4. Each byte column is associated with a set of bitlines, for example, BL1-BL8, BL9-BL16, BL17-BL24 or BL25-BL32. The memory device 200C includes a number of memory sectors, such as 205, 215, 225 and 235, and a number of source lines, such as VSP1, VSP3, VSP5 and VSP8, with each memory byte connected to a source line.

The memory device 200C is similar to the memory device 200B in that the former uses source lines for selecting memory bytes, and does not use byte select transistors. However, unlike memory device 200B, the memory bytes on a same page of the memory device 200C may be in different memory sectors. Similarly, the memory bytes on a same byte column of the memory device 200C may be in different memory sectors. For example, memory sector 205 covers the region of the memory device 200C that includes pages corresponding to WL1 and WL2, and byte columns corresponding to BL1-BL8 and BL9-BL16. The memory bytes associated with WL1, WL2, BL1-BL8 and BL9-BL6, which are 210, 220, 230 and 240, are included in memory sector 205. Memory sector 215 comprises another section of the pages corresponding to WL1 and WL2, and covers byte columns corresponding to BL17-BL24 and BL25-BL32. The memory bytes associated with WL1, WL2, BL17-BL24 and BL25-BL36, which are 260, 265, 280 and 285, are included in memory sector 215.

The memory bytes in each memory sector may be coupled to a source line that is common for the sector, but not shared with any other sector. For example, the memory bytes 210, 220, 230 and 240 are coupled to VSP1 in sector 205; memory bytes 260, 265, 280 and 285 are coupled to VSP3 in sector 215; memory bytes in sector 225 are coupled to VSP5 and memory bytes in sector 235 are coupled to VSP7.

Figure 2D:
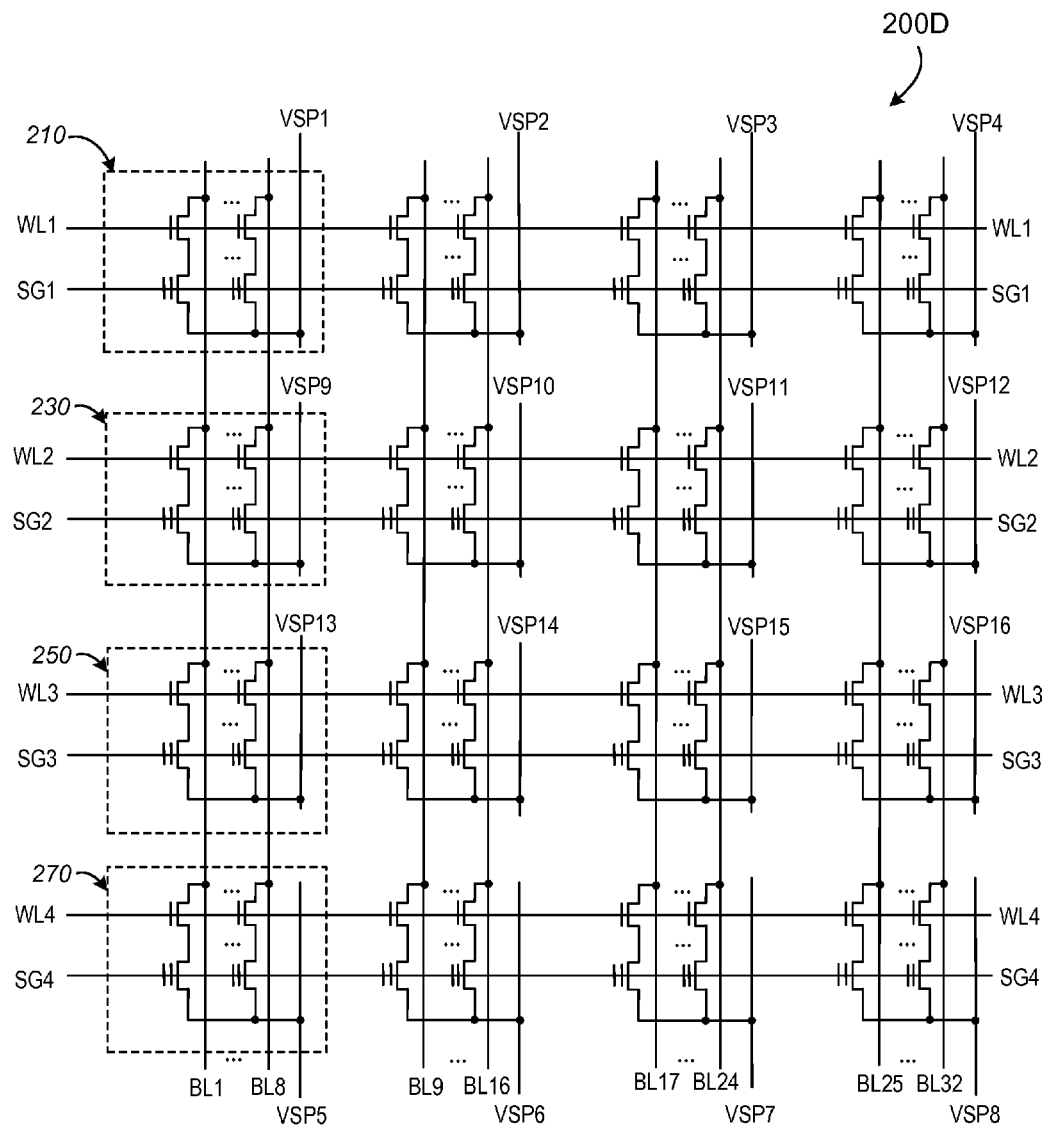

In some implementations, each memory byte may be coupled to a distinct source line that is not shared with any other memory byte. Such an implementation is shown in FIG. 2D, which illustrates an exemplary memory device 200D that uses source lines for selecting memory bytes. The exemplary memory device 200D includes memory bytes, such as 210, 230, 250 and 270, which are arranged in rows and columns. Each row of memory bytes has a common wordline, such as WL1, WL2, WL3 or WL4, and a common sense gate line, such as SG1, SG2, SG3 or SG4. Each column of memory bytes is associated with a set of bitlines, for example, BL1-BL8, BL9-BL16, BL17-BL24 or BL25-BL32. The memory device 200D includes a number of source lines, such as VSP1-16, with each memory byte connected to a source line.

The memory device 200D is similar to the memory devices 200A-200C in that it uses source lines for selecting memory bytes, and does not use byte select transistors. However, unlike the memory devices 200A-200C, each memory byte in the memory device 200D is coupled to a source line that is different from the source lines connected to the other memory bytes. For example, memory byte 210 is coupled to source line VSP1, which is not connected to any other memory byte. Memory bytes 230, 250 and 270, which are vertically stacked with memory byte 210 in the same byte column of the memory device 200C, are coupled to source lines VSP9, VSP13 and VSP5 respectively, which are not shared with any other memory byte.

There exists a one-to-one correspondence between a memory byte and a source line in the memory device 200D. There may be as many source lines as there are memory bytes in the memory device 200D.

Referring back to the exemplary memory device 200A, information in the form of bit values are written to or read from the memory cells through the bitlines. While a bitline and a source line are connected to all the memory cells in the corresponding column, at a given time a single memory cell in the column may be active for reading or writing. The memory cell that is active in the column corresponds to the selected wordline and the sense gate line.

A memory cell in the active memory byte may be accessed for writing by selecting the bitline corresponding to the memory cell. For example, memory cell 212 may be selected by selecting wordline WL1, sense gate line SG1 and bitline BL1, while memory cell 214 may be selected by selecting wordline WL1, sense gate line SG1 and bitline BL8. In this case, the other wordlines WL2-WL4 and sense gate lines SG2-SG4 are unselected, such that bitline BL1 may not access memory cell 232, and bitline BL8 may not access memory cell 234.

In some implementations, data in the memory device 200A may be accessed and erased in units of memory bytes. In such implementations, a memory byte may be selected by selecting the wordline and sense gate line corresponding to the page that includes the memory byte, and, in addition, by selecting the source line corresponding to the column that includes the memory byte. For example, memory byte 210 may be selected by selecting wordline WL1, sense gate line SG1 and source line VSP1. In this case, the other source lines VSP2, VSP3 and VSP4 may be unselected, such that other memory bytes on the same page (for example, 220) are not selected.

In the above context, selecting wordline WL1 may refer to applying a non-zero voltage to wordline WL1, while applying a zero voltage to all other wordlines. Similarly, selecting SG1 may refer to applying a non-zero voltage to SG1, while applying a zero voltage to all other sense gate lines or float other sense gate lines. Likewise, selecting bitline BL1 may refer to applying a non-zero voltage to bitline BL1, while applying a zero voltage to all other bitlines or float other bitlines. In addition, selecting source line VSP1 for erasing memory byte 210 may refer to applying a zero voltage to source line VSP1, while applying a non-zero voltage to all other source lines.

In some implementations, the voltages applied to the selected wordline, sense gate line, source line and bitline may be different from one another. In other implementations, the voltages may be similar, or some of them may be the same, or within certain ranges of each other, while the rest are different. In addition, the some or all of the applied voltages may be negative voltages, while the rest may be non-negative voltages.

Figure 3A:
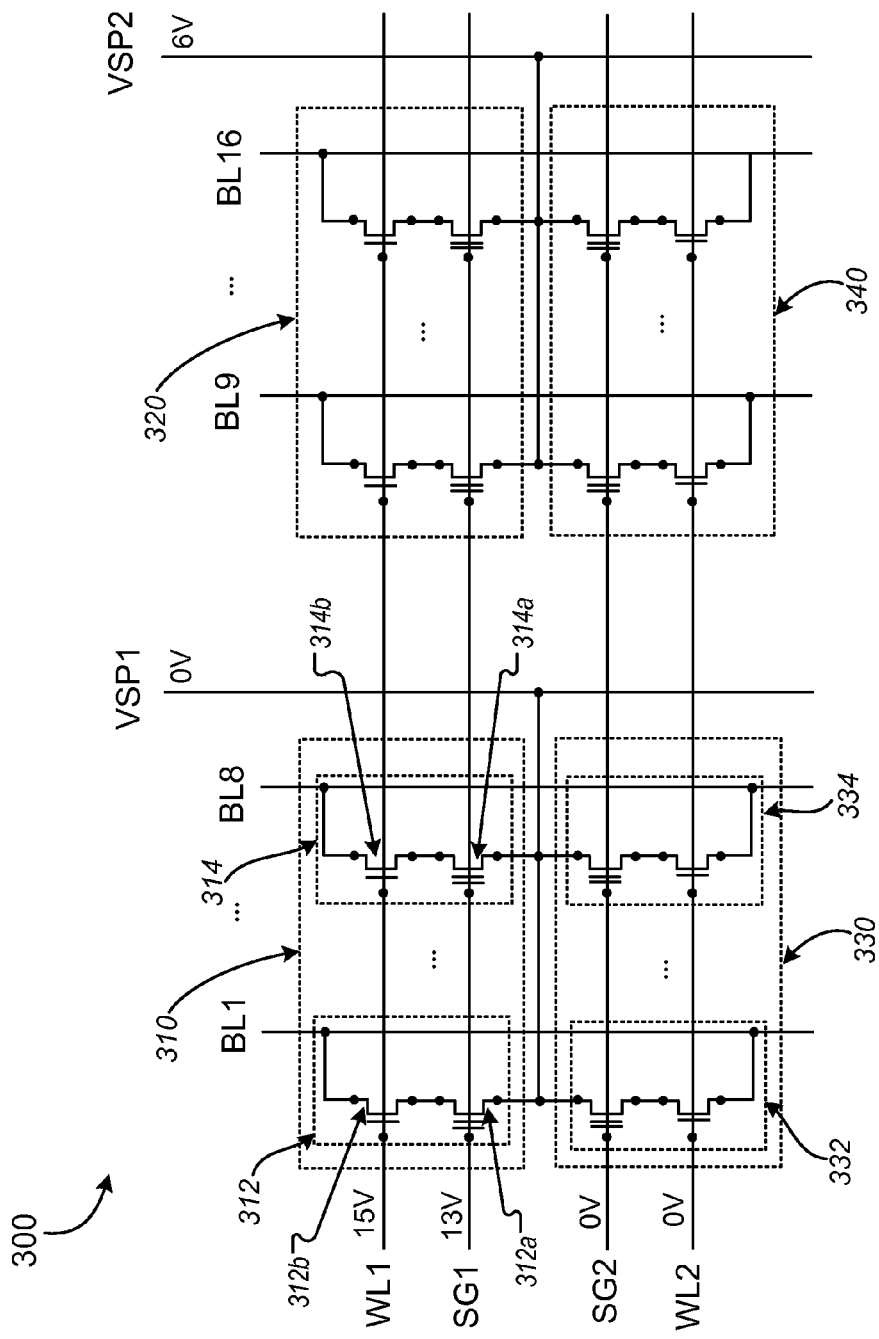
FIGS. 3A-3B are a conceptual block diagrams illustrating write access and clear access for a memory byte using a source line in an exemplary memory device.
Figure 3B:
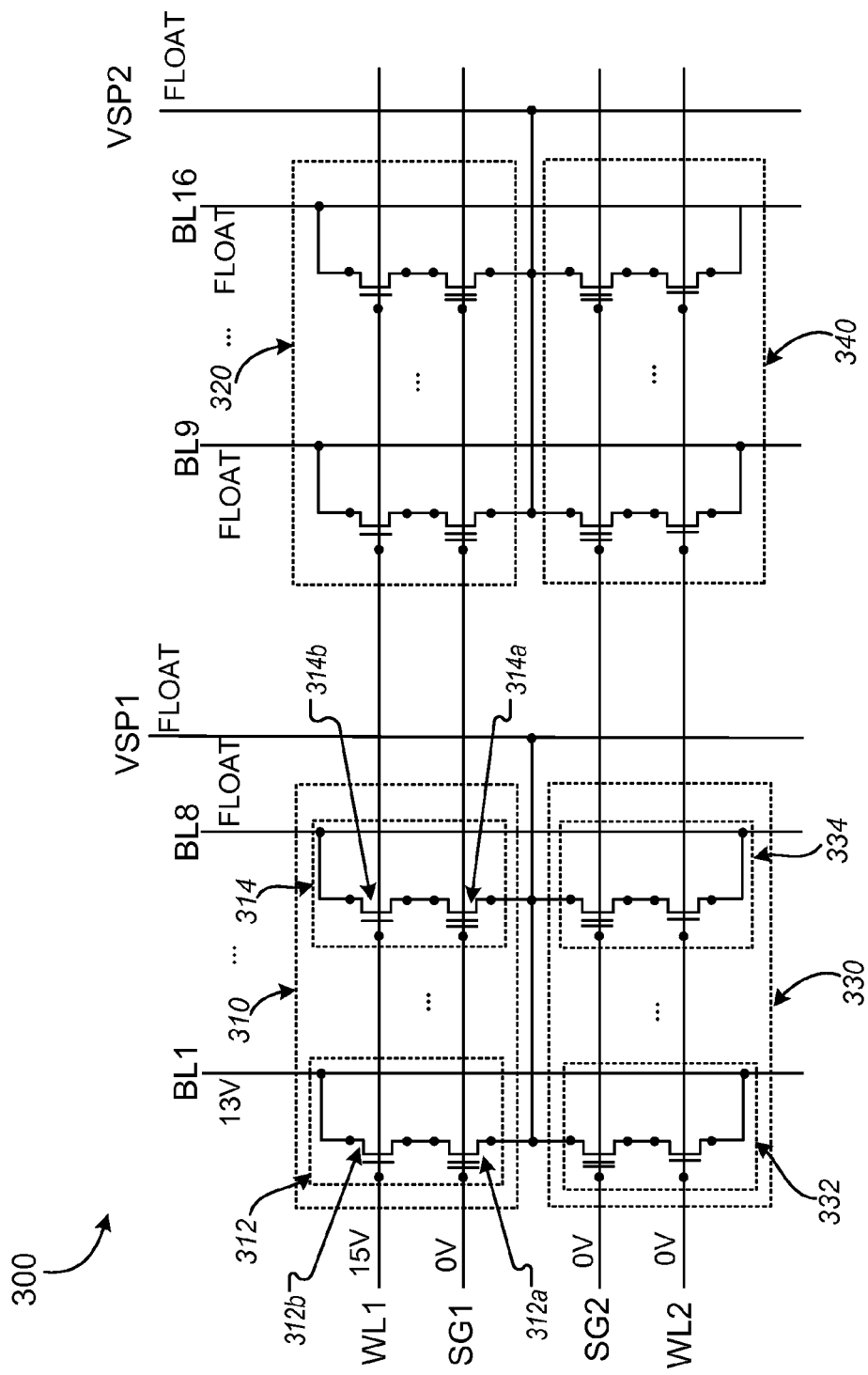

FIGS. 3A-3B are a conceptual block diagrams illustrating write access and clear access for a memory byte using a source line in an exemplary memory device 300. The memory device 300 is an example of a memory device that uses source lines for selecting memory bytes, instead of byte select transistors. In one implementation, the memory device 300 may represent a section of the memory device 200A. However, in other implementations, the memory device 300 may be some other memory device.

FIG. 3A illustrates a clear cycle in the exemplary memory device 300. The memory device 300 includes memory bytes 310 and 320 in one page of memory, and memory bytes 330 and 340 in a second page of memory. Each memory byte includes memory cells, for example, memory byte 310 includes memory cells 312 and 314, while memory byte 330 includes memory cells 332 and 334. Each memory cell includes a sense transistor and a select transistor, such as 312a and 312b respectively in memory cell 312, and 314a, 314b respectively in memory cell 314. The memory device 300 includes wordline WL1 and sense gate line SG1 associated with one page of the memory device, while wordline WL2 and sense gate line SG2 are associated with the second page of the memory device 300. In addition, memory device 300 includes source line VSP1 associated with one byte column of the memory device, while source line VSP2 is associated with a second byte column of the memory device 300.

Each memory byte 310, 320, 330 or 340 may correspond to a memory byte in the memory device 200A. For example, memory byte 310 may correspond to memory byte 210, memory byte 320 may correspond to memory byte 220 and memory byte 330 may correspond to memory byte 230. Similarly, memory cells 312 and 312 may correspond to memory cells 212 and 214 respectively and memory cell 332 may correspond to memory cell 232. Sense transistor 312a and select transistor 312b may correspond to transistors 212a and 212b respectively, while sense transistor 314a and select transistor 314b may correspond to transistors 214a and 214b respectively.

In some implementations, each memory byte 310, 320, 330 or 340 includes eight memory cells, with each cell configured for storing a bit value. For example, memory byte 310 includes memory cells 312, 314 and six other memory cells. Although FIG. 3A shows each memory byte with only two memory cells, it will be understood that each byte may include eight or more memory cells.

In some implementations, the source terminals of sense transistors in a memory byte are coupled to one another and to the source line in the corresponding byte column of the memory device 300. For example, source terminals of 312a and 314a are coupled to one another and to the source line VSP1 that corresponds to the first byte column in memory device 300. However, in some implementations, VSP1 may be coupled to the drain terminals of sense transistors in memory cells that are in the first byte column of the memory device 300. For example, VSP1 may be coupled to the drain terminals of sense transistors 312a and 314a.

In some implementations, the drain terminals of the sense transistors are coupled to the source terminals of the select transistors in the corresponding memory cell. For example, drain terminal of sense transistor 312a is coupled to the source terminal of select transistor 312b in memory cell 312, while drain terminal of sense transistor 314a is coupled to the source terminal of select transistor 314b in memory cell 314.

In some implementations, the drain terminals of the select transistors are coupled to the bitlines corresponding to the associated column of the memory device 300. For example, drain terminal of select transistor 312b is coupled to bitline BL1, while drain terminal of select transistor 314b is coupled to bitline BL8. In addition, bitline BL1 is coupled to the drain terminals of select transistors of memory cells that are vertically stacked with memory cell 312, such as memory cell 332; bitline BL8 is coupled to the drain terminals of select transistors of memory cells that are vertically stacked with memory cell 314, such as memory cell 334.

In some implementations, a wordline is coupled to the gates of the select transistors in the corresponding page of the memory device. For example, wordline WL1 is coupled to the gates of the select transistors such as 312b and 314b in the first page of the memory device 300 that includes bytes 310 and 320. Wordline WL2 is coupled to the gates of the select transistors included in bytes 330 and 340 in the second page of the memory device 300.

In some implementations, a sense gate line is coupled to the gates of the sense transistors in the corresponding page of the memory device. For example, sense gate line SG1 is coupled to the gates of the sense transistors such as 312a and 314a and sense gate line SG2 is coupled to the gates of the select transistors in the second page of the memory device 300.

A memory byte in memory device 300 may be selected for erasing by applying certain voltages to the wordline, sense gate line and source line associated with the memory byte, while applying a different set of voltages to the other wordlines, sense gate lines and source lines. For example, memory byte 310 may be selected by applying a first voltage, such as 0 (zero) or a few volts, such as 15 volts, to the wordline WL1, and a second voltage, such as 13 volts, to the sense gate line SG1. In addition, a third voltage, such as 0 volt is applied to the source line VSP1. In order to prevent other bits, such as the bits in byte 320, in the same selected page from being erased, a fourth voltage, such as 6 volts, is applied to other source lines such as VSP2 or to other bitlines such as BL9-BL16. In the case that other bitlines are connected to the fourth voltage, the applied WL1 voltage should be higher than the fourth voltage. The unselected wordlines, such as WL2, may be connected to 0 volt, and unselected sense gate lines, such as SG2, may be floating or connected to 0 volt. Therefore, other bytes, such as 330 and 340, cannot be erased.

The above values of the applied voltages are merely for illustration; it will be understood that the applied voltages may be other values. The erasure of the bit values stored in the memory cells of memory byte 310 depend on the voltage difference between the gate and source/channel/drain regions of the transistors. Since a relatively high voltage is applied to the sense gate line, all sense transistors in the same row are turned on, and the source, channel and drain regions of each sense transistor are connected together and, thus, have the same potential. Therefore, the voltages that are applied to WL1, SG1 and VSP1 for erasing memory byte 310 are selected such that the voltage difference between the gate and source/channel/drain regions of the transistors in memory byte 310 reach a critical voltage for tunneling effect to take place. It is also important that the voltage applied to the unselected source lines and/or bitlines is high enough so that the voltage difference between the gate and source/channel/drain regions is below the critical voltage to inhibit erase. However, the erase inhibit voltage cannot be too high, so that it does not disturb the data stored in other bits in the unselected column bytes.

In some implementations, more than one memory byte may be selected at the same time in the memory device 300 for erasure. The memory bytes selected at the same time may be on the same page. For example, the memory device 300 may be configured for erasing memory bytes 310 and 320 at the same time. This may be achieved by applying, in addition to VSP1 as described previously, a zero voltage to VSP2, such that the voltage difference between the gate and drain terminals of the transistors in memory byte 320 reach a critical voltage for tunneling effect to take place.

FIG. 3B is a conceptual block diagram illustrating a write cycle in the exemplary memory device 300. In some implementations, bit values may be written to a memory byte in memory device 300 by writing to one memory cell at a time. This may be achieved by applying certain voltages to the wordline, sense gate line and the bitline associated with the selected memory cell. At the same time, a different set of voltages are applied to the other wordlines and sense gate lines, while the other bitlines and source lines are allowed to float, or, in some cases, connected to 0 volt.

As an example, memory byte 310 may be selected for writing by applying a first voltage, such as 15 volts, to the wordline WL1, and a second voltage, such as 0 volt or a negative voltage, to the selected sense gate line SG1. In addition, a third voltage, such as 13 volts, is applied to the bitline or bitlines corresponding to the bit or bits to be written in the memory byte 310. At the same time, the source lines VSP1, VSP2 and the other bitlines can be floating or held at a constant voltage that does not change during the writing cycle. Multiple bits within the same page may be written at the same time by applying the same bitline voltage to those bitlines corresponding to the selected bits for write.

The above values of the applied voltages are merely for illustration; it will be understood that the applied voltages may be other values. In addition, the voltages applied to the other bitlines and the source lines may be allowed to change during the writing cycle.

As described above, the memory devices 200A-200D or the memory device 300 may be used for accessing bytes of memory without using byte select transistors, such as in the conventional memory device 100.

The above may lead to a considerable reduction in the chip area occupied by each memory byte. For example, the layout area for a memory byte in a memory device that uses byte select transistor, such as memory device 100, may be in the range of 8.32 microns. In comparison, the layout area for a memory byte in a memory device implemented as described in the present disclosure, such as memory device 200A, may be in the range of 5.76 microns. The latter leads to a reduction of approximately 30.8% in the area occupied by a memory byte in comparison to the former memory device.

A byte source select latch may be implemented in the memory device 200A or the memory device 300. The byte source select latch may replace the byte select latch used in conventional memory devices, such as memory device 100. This implementation may use an extra transistor that may supply ground or high voltage as needed during clear and write cycles of the memory bytes.

In the memory device 200A or the memory device 300, data latches in page latch area may get one or more extra transistors to supply a "erase recovery" voltage (which maybe a volt or so lower than the column write voltage) after an erase cycle to columns corresponding to bits that had zero data, but are not selected for change during the given erase operation. Other voltages applied to other terminals during erase recovery may be same as the voltages applied during a normal write cycle. The extra control may be provided from the byte source select latch.

In some implementations of the memory device 200A or the memory device 300, a read-back and load to page latch operation may be performed prior to a clear cycle of a memory byte. This operation uses the address counter and reads out locations along the page in which one or more bytes are specified for erase. The data is stored in the column latches but the source latch is not changed.

In addition, the column latch in the memory device 200A or memory device 300 may have circuitry to allow different voltages to pass to the memory array for de-bias or soft write back purposes, which may be used to recover margin. This implementation may have several variations, including select one or more byte for erase; loading data for the rest of the memory bytes in a page; erasing the selected bytes while inhibiting the unselected bytes; performing a write cycle for the selected bytes; and performing a short write cycle to recover any disturbed memory cells during byte erase cycle.

In some implementations, negative voltages may be used to bias the memory cells in the memory device 200A or the memory device 300. In such implementations, the overall maximum voltage may be reduced, leading to smaller chip area or lower manufacturing cost, and better reliability and performance.

The reliability of the memory device 200A or the memory device 300 may be improved by appropriately biasing the terminals of the selected and unselected memory bytes, such that disturbance of the unselected bytes are reduced to an insignificant level. In addition, soft programming for the same page of memory may be employed for further reducing the disturbance of the unselected memory bytes. By employing such techniques, endurance performance degradation of the unselected bytes may be prevented.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A memory device comprising:
   memory sections, each memory section including a plurality of memory cells, wherein the memory sections are arranged in groups of memory sections; and
   source lines associated with the groups of memory sections, wherein memory sections included in a first group of memory sections are coupled to a first source line that is distinct from other source lines associated with other groups of memory sections,
   wherein for an erase operation of a first memory section in the first group of memory sections, a wordline and a sense gate line corresponding to the first memory section are positioned to provide respective non-zero voltages and wordlines and sense gate lines corresponding to other memory sections in the first group of memory sections are positioned to provide zero voltage, and the first source line is configured to provide a known first voltage while source lines associated with other memory sections are configured to provide a known second voltage that is different from the known first voltage.

2. The memory device of claim 1, wherein the known first voltage is zero voltage, while the known second voltage is a non-zero voltage.

3. The memory device of claim 1, wherein the wordline corresponding to the first memory section is positioned to provide a first non-zero voltage and the sense gate line corresponding to the first memory section is positioned to provide a second non-zero voltage that is different from the first non-zero voltage.

4. The memory device of claim 1, wherein the first group of memory sections includes a plurality of memory sections in a same column of the memory device, and
   wherein the plurality of memory sections included in the first group of memory sections correspond to two or more rows of the memory device.

5. The memory device of claim 1, wherein the first group of memory sections includes a plurality of memory sections corresponding to two or more columns of the memory device, and
   wherein the plurality of memory sections included in the first group of memory sections correspond to two or more rows of the memory device.

6. The memory device of claim 1, wherein a memory section corresponds to a memory byte.

7. The memory device of claim 1, wherein a memory section is not associated with a byte select transistor.

8. The device of claim 1, wherein the plurality of memory cells in a memory section are arranged in rows and columns, and wherein the plurality of memory cells in the memory section are selectable by a same wordline while each memory cell in the memory section is selectable by a different bitline.

9. The memory device of claim 8, wherein a memory cell includes a select transistor and a sense transistor,
   wherein the select transistor comprises a gate terminal coupled to a wordline, and a drain terminal coupled to a bitline, and
   wherein the sense transistor comprises a gate terminal coupled to a sense gate line, and a source terminal coupled to a source line associated with the memory section that includes the memory cell.

10. The memory device of claim 8, wherein for a write operation of a memory cell included in the first memory section, a wordline and at least one bitline associated with the first memory section are configured to provide respective non-zero voltages, while a sense gate line associated with the first memory section is configured to provide zero voltage, and
    wherein wordlines and sense gate lines corresponding to memory sections in other rows are configured to provide zero voltage.

11. The memory device of claim 10, wherein the write operation is independent of voltages provided by the first source line and source lines corresponding to the other groups of memory sections.

12. The memory device of claim 1, wherein the memory device comprises an Electrically Erasable Programmable Read-Only Memory (EEPROM).

13. A system comprising:
    a memory device that includes:
       memory sections, each memory section including a plurality of memory cells, wherein the memory sections are arranged in groups of memory sections; and
       source lines associated with the groups of memory sections, wherein memory sections included in a first group of memory sections are coupled to a first source line that is distinct from other source lines associated with other groups of memory sections; and instructions stored in a machine-readable medium that, when executed, are configured to cause a processor to perform an erase operation on a first memory section in the first group of memory sections, the erase operation comprising:

providing respective non-zero voltages to a wordline and a sense gate line corresponding to the first memory section and providing zero voltage to wordlines and sense gate lines corresponding to other memory sections in the first group of memory sections; and providing a known first voltage to the first group of memory sections using the first source line while providing a known second voltage that is different from the known first voltage to other memory sections using source lines associated with the other memory sections.

14. The system of claim 13, wherein the wordline corresponding to the first memory section is positioned to provide a first non-zero voltage and the sense gate line corresponding to the first memory section is positioned to provide a second non-zero voltage that is different from the first non-zero voltage.

15. The system of claim 13, wherein the first group of memory sections includes a plurality of memory sections in a same column of the memory device, and wherein the plurality of memory sections correspond to two or more rows of the memory device.

16. The system of claim 13, wherein the first group of memory sections includes a plurality of memory sections corresponding to two or more columns of the memory device, and wherein the plurality of memory sections included in the first group of memory sections correspond to two or more rows of the memory device.

17. The system of claim 13, wherein a memory section is not associated with a byte select transistor.

18. The system of claim 13, wherein the plurality of memory cells in a memory section are arranged in rows and columns, and wherein the plurality of memory cells in the memory section are selectable by a same wordline while each memory cell in the memory section is selectable by a different bitline.

19. The system of claim 18, wherein a memory cell includes a select transistor and a sense transistor, wherein the select transistor comprises a gate terminal coupled to a wordline, and a drain terminal coupled to a bitline, and wherein the sense transistor comprises a gate terminal coupled to a sense gate line, and a source terminal coupled to a source line associated with the memory section that includes the memory cell.

20. The system of claim 18, wherein the instructions are further configured to cause the processor to perform a write operation of a first memory cell in the first memory section, the write operation comprising:

providing non-zero voltages to a wordline and at least one bitline associated with the first memory section, while providing zero voltage to a sense gate line associated with the first memory section; and providing zero voltage to wordlines and sense gate lines corresponding to memory sections in other rows.

21. The system of claim 20, wherein the write operation is independent of voltages provided by the first source line and source lines corresponding to the other groups of memory sections.

* * * * *